Figure 1:
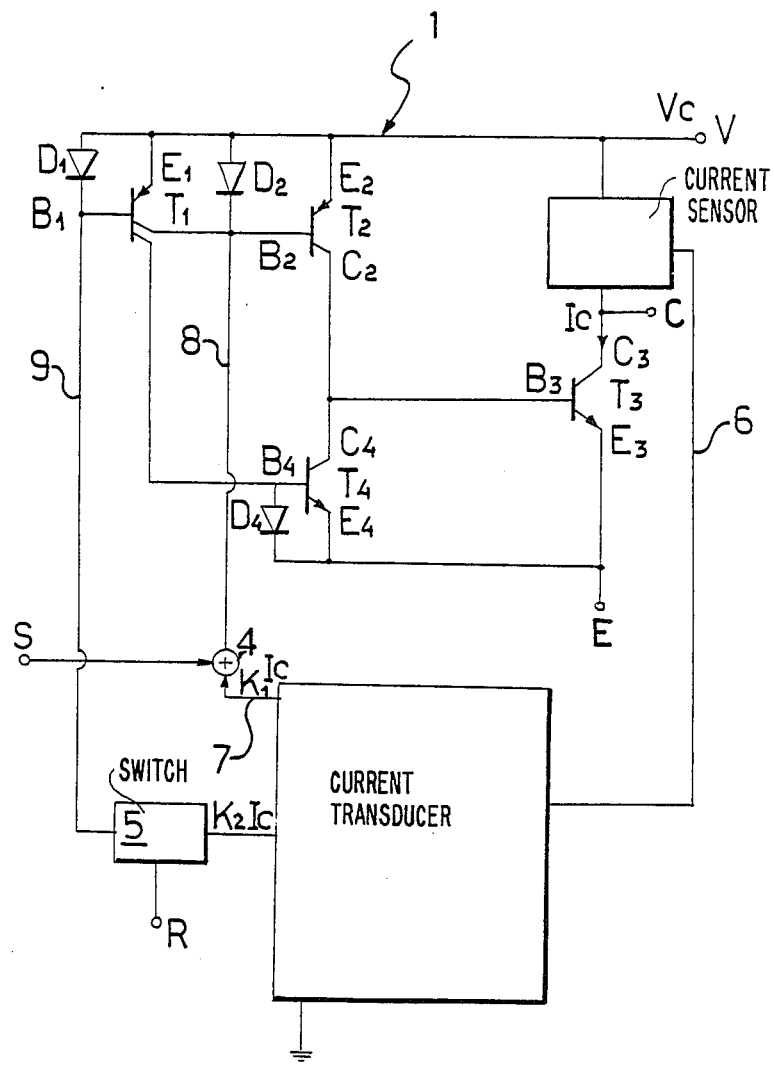

United States Patent [19]

Chieli

[11] Patent Number: 4,763,016
[45] Date of Patent: Aug. 9, 1988

[54] FEEDBACK CONTROL DEVICE FOR SWITCHING OFF A TRANSISTOR

[75] Inventor: Davide Chieli, Milan, Italy

[73] Assignee: SCG-Thomson Microelectronics S.p.A., Catania, Italy

[21] Appl. No.: 937,879

[22] Filed: Dec. 4, 1986

[30] Foreign Application Priority Data

Feb. 6, 1986 [IT] Italy ................. 19309 A/86

[51] Int. Cl.$^4$ ............ H03K 17/60; H03K 17/56; H03K 13/33
[52] U.S. Cl. ............ 307/254; 307/246; 307/300; 307/299.3
[58] Field of Search ........ 307/300, 254, 259, 359, 307/355, 246, 247; 323/289

[56] References Cited

U.S. PATENT DOCUMENTS

| 4,132,906 | 2/1979 | Allen | 307/300 |
| 4,318,011 | 3/1982 | Zeis | 307/300 |
| 4,410,810 | 10/1983 | Christen | 307/300 |
| 4,502,016 | 2/1985 | Siligoni et al. | 330/146 |

Primary Examiner—Stanley D. Miller
Assistant Examiner—B. P. Davis
Attorney, Agent, or Firm—Rosen, Dainow & Jacobs

[57] ABSTRACT

A circuit device is provided for feedback controlling a transistor to switch off which is incorporated to a transfer circuit as the last stage thereof, and when, during the "off" phase, a current is drawn through its base by another transistor, referred to as the switch-off transistor, which is conductive for just the time required for said switching off to take place.

9 Claims, 2 Drawing Sheets

FEEDBACK CONTROL DEVICE FOR SWITCHING OFF A TRANSISTOR

DESCRIPTION

This invention relates to a feedback control device for switching off a transistor in the last stage of a transfer circuit.

In particular, the control device of this invention is useful to controllably switch off a transistor which forms the last stage of a so-called transfer circuit, such as a circuit which develops at different times at its output terminals two different electric voltage levels, and which can switch from the one over to the other of said levels on an external command.

Of course, that switching over would take place across a load, known per se, which may be connected either to the collector or the emitter of the transistor forming the final stage of the transfer circuit.

Transfer operation involves switching on or off—depending on the circuit original condition—a transistor which forms the last stage in the transfer circuit. More specifically, said transistor to be switched off would be connected electrically through its base to the collector of a drive transistor and the collector of a switch-off transistor, the latter transistors being connected, in turn, through their bases to a transistor which forms the first stage in said transfer circuit.

As is known, a major problem associated with the use of transistor-containing transfer circuits is to provide accurate control of the duration of the off state of certain transistors during the transfer operations.

A prior approach to the provision of that switch-off, and hence circuit switch-over, feature has been to switch off said transistor forming the last stage in the circuit by means of another transistor, the so-called switch-off transistor, which is held in a saturation zone (SAT) throughout the time period when the former transistor is to be held in the off state.

Thus, the switch-off transistor is caused to conduct, specifically in the saturation zone, whenever the circuit is to be switched over by drawing a current from the base of the transistor to be switched off, causing it to assume the off state and the overall circuit to switch over.

Another prior approach, as disclosed in Italian Pat. No. 23646 A/81 (corresponding to U.S. Pat. No. 4,502,016), provides a device which senses the saturation voltage of the so-called drive transistor being fed to the last stage of the transfer circuit. That device is effective to hold the switch-off transistor in the conductive state, particularly in a forward active zone (ZAD) until the drive transistor comes out of its saturaturation operating zone.

In the former instance, a major drawback is associated with the switch-off transistor operating in a zone of high saturation, since a build-up of electric charges is liable to occur in a saturated transistor which, on the occasion of a subsequent switch-over, must be removed before the last stage in the transfer circuit can be returned to its conductive state; this introduces a significant time delay in the circuit response to external commands directed to switch it over.

In the latter instance, the switch-off transistor operates in a forward active zone, but the approach, while substantially achieving its objective, relies on the state of the drive transistor rather than on the actual state of the transistor to be switched off, and has the drawback of requiring incorporation to the circuit of a device adapted to sense the saturation voltage of the drive transistor.

The problem underlying this invention is to provide a control circuit arrangement for a transfer circuit incorporating a switch-off transistor, which arrangement enables operation of the switch-off transistor for just the time period required to switch off the transistor to be switched off and forming the last stage in the transfer circuit, thus obviating the drawbacks of the cited prior art.

This problem is solved, in accordance with the invention, by a feedback control device for switching off a transistor forming the last stage in a transfer circuit and being connected electrically through its base to a collector of a drive transistor and a collector of a switch-off transistor, the last-named transistors being connected, in turn, through their bases to a transistor forming the first stage in said transfer circuit, characterized in that it comprises:

a current sensor interposed to said transistor to be switched off and one pole of the power supply;

a current transducer connected electrically to said sensor;

a switch interposed to said transducer and said first stage of said transfer circuit.

The invention features and advantages will be better understood from the following description in conjunction with the accompanying drawings illustrating by way of example and not of limitation a preferred embodiment thereof.

Figure 2:
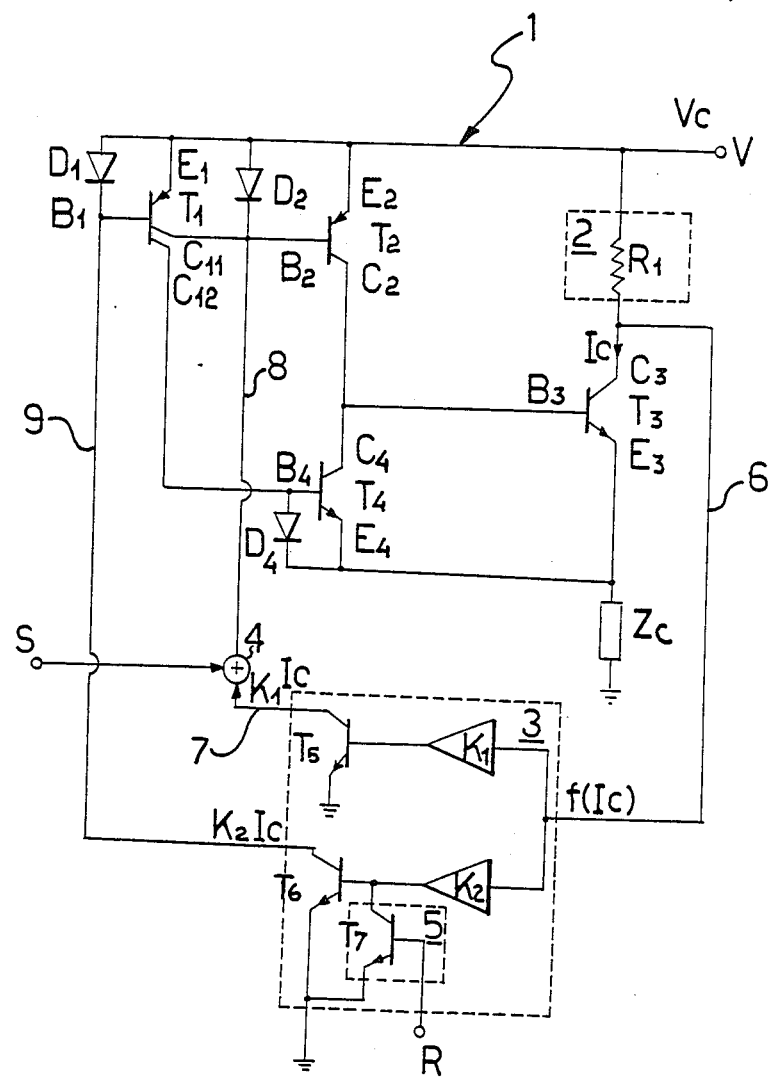

In the drawings:

FIG. 1 shows a block diagram of a feedback control device according to the invention; and FIG. 2 is a detail view of the device of FIG. 1 and its connections to the transfer circuit.

With reference to the drawings, generally indicated at 1 is a transfer circuit which comprises, as the last stage thereof, a transistor T3 to be switched off, which is connected through its base B3 to a collector C2 of a drive transistor T2 and a collector C4 of a switch-off transistor T4, the last-named transistors being connected, in turn, through their bases B2 and B4, respectively to the collectors C11 and C12 of a single transistor T1 forming the first stage of said transfer circuit 1.

Indicated at 2 is a current sensor interposed to the collector C3 of said transistor to be switched off, T3, and a positive pole Vc of the supply voltage.

The numeral 3 designates a current transducer connected electrically via a lead 6 to said current sensor 2.

The numeral 4 designates a summing node, not further detailed circuit-wise because known per se, which is connected electrically via a lead 7 to said current transducer 3, and via a lead 8 to the base B2 of said drive transistor T2 of the transfer circuit 1.

Indicated at 5 is a block comprising a switch intervening on a connection cable 9 which connects said transducer 3 to the base B1 of said first stage T1 of the transfer circuit 1. Said switch 5 is would be incorporated to said current transducer 3 in the actual circuit.

Also indicated are terminals C and E located respectively on the collector and the emitter of the transistor T3 to be switched off and adapted to be connected to a load, assumed to be external of the transfer circuit 1 and known per se.

With particular reference to FIG. 2, said transfer circuit 1 comprises, as its last stage, said transistor T3 to be switched off, of the npn type, with the emitter E3 grounded through a conventional load Zc, the collector C3 connected to said pole Vc of the supply voltage through a resistor R1 which forms said current sensor 2, and the base B3 connected to the collector C4 of a switch-off transistor T4 of the npn type and the collector C2 of a drive transistor T2 of the pnp type.

Said switch-off transistor T4 has its emitter E4 connected to the emitter of $T_3$ and its base B4 connected electrically to a collector C12 of said transistor T1, having two collectors and being of the pnp type, which forms said first stage of the transfer circuit 1.

Between said base B4 and said emitter E4 there is interposed a unidirectional element, specifically a diode D4.

The drive transistor T2 of the pnp type has instead its emitter E2 connected to said supply pole Vc and its base B2 both connected to the pole Vc with the interposition of a diode D2 and to a collector C11 of said transistor T1 of the transfer circuit first stage. The transistor T1 has its emitter E1 connected to the pole Vc and its base B1 connected to the emitter E1 itself through a diode D1.

Said electric interconnection lead 6 has one end connected to the collector C3 of the transistor T3 to be switched off, and its other end connected to an input of said current transducer 3. The current transducer 3 comprises a pair of amplifiers K1 and K2 which are parallel-connected to each other and both connected electrically to said collector C3 through said cable conductor 6.

The first amplifier in the pair, K1, has at its output a base B5 of a transistor T5 with the emitter E5 grounded and the collector C5 connected to said summing node 4.

The second amplifier K2 in the pair has its output leading to a node A whence the base B6 issues of a transistor T6 with the emitter E6 grounded and the collector C6 connected electrically to the base B1 of the first stage T1 in the transfer circuit 1 by means of said cable conductor 9.

Also connected to said node A is the collector C7 of a transistor T7 having its emitter E7 grounded and its base B7 connected to an external terminal R. Said transistor T7 forms said switch 5, and the terminal R represents a terminal of an external switch, not shown, which controls the off-state of the transistor T3 to be switched off.

The summing node 4 has an input also connected to an external terminal S which represents, in turn, a terminal of an external switch, not shown, which controls instead the on-state of said transistor T3.

The summing node 4 has then an output connected electrically to the base B2 of the drive transistor T2 via the lead 8.

The operation of the device according to this invention is based on the magnitude of the collector current Ic of the transistor T3 to be switched off as measured by the sensor 2; a voltage signal, which is a function of said current, is picked up from the collector C3 of the transistor T3 and supplied, over the lead 6, to the input of the current transducer 3. The transducer will amplify that signal, through the parallel-connected amplifier pair K1 and K2, and output, through the transistors T5 and T6, respectively, first and second signals which are proportional to said collector current.

The summing node 4 may be likened to a logic OR gate having two inputs, one of which is connected by the lead 7 to the current transducer 3, whilst the other input is connected to the external terminal S where the "on" signal appears.

The summing node 4 can receive, therefore, at its input both an "on" signal from the terminal S and a proportional signal to the collector current of the transistor T3 to be switched off as output by the current transducer 3.

The output from said summing node is fed back to the base B2 of the drive transistor T2 through the cable conductor 8.

Should the "on" command be extant, then the "on" signal will switch on, through the summing node 4, the drive transistor T2 which switches on, in turn, the transistor T3; at this time, the current sensor 2 and transducer 3 will hold on, through the feedback signal proportional to the collector current from the summing node 4, both transistors T2 and T3, even in the absence of the "on" signal.

The second proportional signal to the collector current of the transistor T3 as generated by the transducer 3 is sent instead, through the lead 9 and by interposition of the switch 5, to the base B1 of the transistor T1 in the first stage of the transfer circuit 1.

Should an "off" signal be supplied to the terminal R, the transistor T7 forming the switch 5 will enable supply of the transistor T1 in the first stage of the transfer circuit 1 with a proportional signal to the collector current Ic of the transistor T3 to be switched off. The transistor T1 will, in turn, switch on the switch-off transistor T4, and they will both switch off the drive transistor T2 and transistor T3 to be switched off, respectively, thus switching over the overall circuit 1.

An apparent advantage of the device according to the invention is that as the transistor T1 is being switched off in the first stage of the transfer circuit, the transistor T1 can be held at the boundary of the saturation zone sufficiently to effectively switch off the drive transistor T2 and concurrently switch on the switch-off transistor T4, which results in the last stage T3 being switched off, and hence, effectuation of the transfer operation.

The advantage is afforded of lower power requirements, and above all, of a faster transfer rate in both the off and on phases.

I claim:

1. A transfer circuit comprising an output transistor forming the last stage in the transfer circuit, a drive transistor, a switch-off transistor, and an input transistor forming the first stage in the transfer circuit, each of said transistors having base, emitter, and collector, the output transistor base being connected to the drive transistor collector and the switch-off transistor collector, the input transistor collector being connected to the drive transistor base and the switch-off transistor base, the emitter or collector of the output transistor constituting its output for connection to a load, and a feedback control circuit for controlling the turn-off of the output transistor, said feedback control circuit comprising:

a current sensor connected between the output of the output transistor and a supply line and generating a signal while the output transistor is ON, a current transducer whose input is connected to receive the sensor signal and whose output is coupled to the transfer circuit, and switch means connected between the current transducer output and the first stage of the transfer circuit for turning-off the output transistor.

2. A transfer circuit comprising an output transistor forming the last stage in the transfer circuit, a drive transistor, a switch-off transistor, and an input transistor forming the first stage in the transfer circuit, each of said transistors having base, emitter, and collector, the output transistor base being connected to the drive transistor collector and the switch-off transistor collector, the input transistor collector being connected to the drive transistor base and the switch-off transistor base, the emitter or collector of the output transistor constituting its output for connection to a load, the switch-off transistor being normally OFF when the output transistor is ON, and a feedback control circuit for controlling the turn-off of the output transistor, said feedback control circuit comprising:

a current sensor connected between the output of the output transistor and a supply line and generating a signal while the output transistor is ON, a current transducer whose input is connected to receive the sensor signal and whose output is coupled to the transfer circuit, and switch means connected between the current transducer output and the first stage of the transfer circuit for turning-off the output transistor, said feedback control circuit functioning to detect the state of the ON condition of the output stage, and, upon operation of the switch means intended to turn-off the output transistor, the feedback control circuit supplies a signal to the transfer circuit which turns-on the switch-off transistor and turns-off the drive transistor, causing the output transistor to be turned-off in a controlled manner.

3. A transfer circuit as claimed in claim 2, wherein the current transducer output is connected both to the base of the input transistor and the base of the drive transistor.

4. A transfer circuit as claimed in claim 2, wherein said current sensor comprises a resistor connected between the output transistor collector and a supply line.

5. A transfer circuit as claimed in claim 4, wherein the current transducer comprises a pair of parallel-connected amplifiers whose inputs are connected to the output transistor collector, the transducer further comprising two coupling transistors each having base, emitter, and collector, the emitters of each of the coupling transistors being grounded, the output of each amplifier being connected, respectively, to the base of a coupling transistor.

6. A transfer circuit as claimed in claim 5, wherein the switch means comprises a transistor having a grounded emitter, a base connected to an external-off control, and a collector connected to a base of one of the coupling transistors.

7. A transfer circuit as claimed in claim 2, further comprising a summing node having first and second inputs and an output, an external-on control, the summing node first input being connected to an output of the current transducer, the summing node second input being connected to the external-on control, the summing node output being connected to the drive transistor base.

8. A transfer circuit as claimed in claim 6, further comprising a summing node having first and second inputs and an output, an external-on control, the summing node first input being connected to the collector of the other of the coupling transistors, the summing node second input being connected to the external-on control, the summing node output being connected to the drive transistor base, the collector of said one coupling transistor being connector to the base of the input transistor.

9. A transfer circuit as claimed in claims 1 or 2 wherein the output transistor output for connection to the load is taken from its emitter, and the current sensor is connected between the output transistor collector and the supply line.

* * * * *

UNITED STATES PATENT AND TRADEMARK OFFICE
CERTIFICATE OF CORRECTION

PATENT NO. : 4,763,016
DATED : August 9, 1988
INVENTOR(S) : Davide Chieli

It is certified that error appears in the above-identified patent and that said Letters Patent is hereby corrected as shown below:

On the title page, after Assignee change "SCG" and insert --SGS--.

Signed and Sealed this

Fourteenth Day of February, 1989

Attest:

DONALD J. QUIGG

Attesting Officer

Commissioner of Patents and Trademarks